United States Patent [19]

Lynch et al.

[11] Patent Number: 4,469,775

[45] Date of Patent: Sep. 4, 1984

[54] MULTI-LAYER ELEMENTS WITH POLYVINYL ALCOHOL OVERCOAT SUITABLE FOR THE PRODUCTION OF RELIEF PRINTING PLATES

[75] Inventors: John Lynch, Monsheim; Rudolf Vyvial, Ludwigshafen; Manfred Zuerger, Sinsheim; Klaus Borho, Mutterstadt, all of Fed. Rep. of Germany

[73] Assignee: BASF Aktiengesellschaft, Fed. Rep. of Germany

[21] Appl. No.: 398,821

[22] Filed: Jul. 16, 1982

[30] Foreign Application Priority Data

Jul. 22, 1981 [DE] Fed. Rep. of Germany ....... 3128950

[51] Int. Cl.³ .......................... G03C 1/68; G03C 1/74
[52] U.S. Cl. ....................................... 430/273; 430/909
[58] Field of Search ................................ 430/273, 909

[56] References Cited

U.S. PATENT DOCUMENTS

| 3,458,311 | 7/1969 | Alles et al. | 430/273 |
| 3,630,746 | 12/1971 | Takimoto et al. | 430/909 |
| 3,801,328 | 4/1974 | Takimoto et al. | 430/909 |
| 3,936,254 | 2/1976 | Sawada et al. | 425/89 |
| 4,072,527 | 2/1978 | Fan | 430/273 |

FOREIGN PATENT DOCUMENTS 1082026 7/1980 Canada .
1416440 12/1975 United Kingdom .

Primary Examiner—Richard L. Schilling
Attorney, Agent, or Firm—Keil & Weinkauf

[57] ABSTRACT

Multi-layer photopolymer elements, which are suitable for the production of relief printing plates and contain photosensitive polyvinyl alcohol/monomer layers which can be developed with water, can be improved in respect of their production, drying and shelf life by the application of a thin layer of a highly hydrolyzed low molecular weight polyvinyl alcohol.

18 Claims, No Drawings

MULTI-LAYER ELEMENTS WITH POLYVINYL ALCOHOL OVERCOAT SUITABLE FOR THE PRODUCTION OF RELIEF PRINTING PLATES

The present invention relates to a process for improving the shelf life and, in particular, the production and drying of multi-layer photopolymer elements which are suitable for the production of relief printing plates and, in particular, of letterpress printing plates, and contain photosensitive polyvinyl alcohol/monomer layers which can be developed with water, wherein a thin layer of a highly hydrolyzed low molecular weight polyvinyl alcohol is applied to the relief-forming polyvinyl alcohol/monomer layer.

Multi-layer elements which are suitable for the production of relief printing plates and contain photosensitive layers R comprising a polyvinyl alcohol/monomer mixture, where the monomer is a 2-hydroxyalkyl ester of acrylate or methacrylate are known per se (cf., for example, German Laid-Open Applications DOS No. 1,902,639, DOS No. 1,917,917, DOS No. 2,114,767, DOS No. 2,402,808 and DOS No. 2,846,647, British Pat. No. 1,416,440, and U.S. Pat. No. 3,801,328). However, printing plates of this type are not entirely satisfactory in respect of their production and storage.

Multi-layer elements which can be developed with water, in particular printing plates which contain a photosensitive layer comprising a polyvinyl alcohol/monomer mixture, can, for example, be produced in a conventional manner by applying a concentrated aqueous solution of the layer constituents to a dimensionally stable base B, for example a steel sheet provided with an adhesive, and drying the applied layer. A possible method of production is described in German Laid-Open Application DOS No. 2,402,808. In many cases, it is advantageous first to apply the photosensitive layer R to a temporary base, such as a plastic belt or plastic film, and to predry the layer, for example in a tunnel dryer, and then, in a second stage, to laminate the resulting layer R and the temporary sheet-like base onto the permanent base B, for example a metal sheet, to peel off the temporary sheet-like base and then to dry the layer further until the desired amount of moisture remains.

However, there are a few problems associated with the simple methods of production. Thus, in some cases, the half-dry layer R adheres inadequately to the temporary base, and this may cause the resulting layer R to become detached or to exhibit unacceptable variations in thickness. Moreover, in many cases relatively large amounts of monomers, in particular hydroxyalkyl acrylates or methacrylates, evaporate during the drying of the layers containing water and monomers, thus causing an odor nuisance and producing unpredictable variations in the thickness of the layer R due to shrinkage, and changes in the composition of the layer. Printing plates of reproducible high quality are difficult to produce where the layer R is about 500 μm thick, and impossible to produce where this layer is thicker still. In addition, a disadvantage of the conventional polyvinyl alcohol printing plates which can be developed with water is the fact that when they are stored exposed to air in printing works their properties deteriorate owing to losses of monomer.

It is an object of the present invention to temper or to eliminate the above disadvantages in the production, drying and storage of multi-layer elements suitable for the production of relief printing plates which can be developed with water.

We have found that this object is achieved and that, surprisingly, a multi-layer element comprising
 (a) a dimensionally stable base B and
 (b) a photosensitive layer R which has a bulk density of from 100 to 70,000 mg/dm$^2$ and contains a mixture which is soluble or dispersible in an aqueous solvent and comprises
  (b1) a 2-hydroxyalkyl acrylate and/or methacrylate where alkyl is of 2 or 3 carbon atoms, with or without one or more additional photopolymerizable, ethylenically unsaturated monomers,
  (b2) one or more polyvinyl alcohols which are soluble or dispersible in water and have a degree of hydrolysis of 74–88 mole% and an average degree of polymerization of 200–2,000, and
  (b3) one or more photoinitiators,
can be improved in respect of its production, drying and storage, and can be obtained with reproducible properties, by applying to the layer R, which may be still wet, half-dry or substantially dry, a top layer D which is about 0.1–10 μm thick when dry and consists of a polyvinyl alcohol having a degree of hydrolysis of not less than 95 mole% and a viscosity of 2–8 mPa.s (measured as a 4% strength by weight aqueous solution at 20° C.).

The polyvinyl alcohol top layer can, for example, be applied in a conventional manner to the moist relief layer R (on the permanent base B), but it is also possible to apply it to the predried relief layer R. The application can be effected by, for example, roller coating, spraying, dip coating, spin coating or casting, for example with a curtain coater. However, it is also possible, and in many cases particularly advantageous, to produce the polyvinyl alcohol top layer on a temporary base, such as a plastic film or belt, by, for example, casting, kiss-coating, spraying, roller coating or gravure-roller coating, and then to transfer the resulting film to the relief layer R by bringing the two into contact. Thus, it has proved advantageous to provide a film, for example a polyester film (as the temporary base), with a thin polyvinyl alcohol top layer, and then to produce the layer R on the coated side of the temporary base, for example by casting from a concentrated solution of the layer constituents. Preferably, the polyvinyl alcohol layer applied to the film is dried for a few minutes at above 80° C. before further processing. The film provided with the polyvinyl alcohol top layer and with the layer R can then be laminated, on the side bearing the layer R, onto the permanent base B, which may or may not be pretreated, and the film can be peeled off, leaving the thin polyvinyl alcohol top film on the photosensitive layer R. During the subsequent drying, the polyvinyl alcohol top film allows the water to pass out, but at the same time prevents the layer R from losing the hydroxyalkyl (meth)acrylate monomers which otherwise would be readily evaporated with the water. Only in this manner is it possible to produce printing plates containing a layer R of more than 500 μm thickness which have reproducible properties. The thin polyvinyl alcohol top layer also prevents migration of the monomers during later storage, thus permitting the plates to be stored exposed to air without their properties deteriorating. In addition, the top film reduces any tackiness which the layer R may possess, and prevents undesirable skin contact with any toxic or skin-irritating monomers in the layer R. Moreover, the thin polyvinyl alcohol top layer makes it possible to dispense with a protective film which has to be peeled off mechanically before the relief plate is exposed or developed.

The novel polyvinyl alcohol top layer has a thickness of from 0.1 to 10 μm, in particular from 0.5 to 5 μm, when dry. A layer with a bulk density of from 1.0 to 100, in particular from 5 to 50, mg/dm² has proved suitable. Particularly suitable polyvinyl alcohols are hydrolyzed polyvinyl esters, such as hydrolyzed polyvinyl acetates, which have a relatively narrow molecular weight distribution, ie. do not contain any high molecular weight components which would adversely affect the washout characteristics of the relief plate. The polyvinyl alcohol has a degree of hydrolysis of not less than 95 mole%, in particular of 98 mole% and above, and a viscosity of from 2 to 8 mPa.s (measured as a 4% strength aqueous solution at 20° C.). The polyvinyl alcohols used according to the invention for the top layer D act as a barrier to the monomers of the layer R, whereas these monomers are substantially compatible with the polyvinyl alcohol used in the layer R. They are suitable for the purpose of the invention, although low molecular weight polyvinyl alcohols with a high degree of hydrolysis have a pronounced tendency to crystallize. Although the polyvinyl alcohol top layer itself is very permeable to light and UV light, and has a refractive index very similar to that of glass, it can be advantageous for some purposes to add other substances, such as dyes or pigments, in particular finely divided pigments, during the production of this top layer, in order to modify its optical and mechanical properties, such as its abrasion resistance or its roughness. Thus, the addition of 2% by weight of a yellow pigment with a mean particle size of less than 1 μm has proved useful. It is also possible to facilitate the positioning of the photographic negative or positive on the plate during printing down by providing the polyvinyl alcohol top layer with a rough surface, ie. having a peak-to-valley height of, in particular, about 1–5 μm.

The photosensitive layer R, ie. the layer which subsequently forms the relief, has a bulk density of in general from 100 to 70,000 mg/dm², in particular from 500 to 50,000 mg/dm², when dry, and is in general from 10 μm to 7 mm, in particular from 400 μm to 1 mm, thick. The layer contains, as an essential constituent, a compatible polyvinyl alcohol/monomer mixture which contains a photoinitiator, is soluble or dispersible in an aqueous solvent, and is of a type which is known per se. The water-soluble or water-dispersible polyvinyl alcohol has a degree of hydrolysis of 74–88, in particular 80–88, mole%, and an average degree of polymerization of 200–2,000, in particular 250–700, and preferably 300–500.

The monomers contained in the mixture are 2-hydroxyalkyl acrylates and/or methacrylates, where alkyl is of 2 or 3 carbon atoms, such as 2-hydroxyethyl acrylate, 2-hydroxypropyl methacrylate and in particular 2-hydroxyethyl methacrylate. It is of course also possible to use mixtures which additionally contain other photopolymerizable ethylenically unsaturated monomers which form a compatible or homogeneous layer R but are incompatible with the polyvinyl alcohol of the top layer D. It is preferable additionally to use monomers having more than one ethylenically unsaturated double bond, examples being ethyleneglycol diacrylate and dimethacrylate, polyethyleneglycol diacrylate and dimethacrylate, butanediol 1,4-diacrylate and 1,4-dimethacrylate, and 1,1,1-trimethylolpropane triacrylate and trimethacrylate. The total amount of monomers (b1) is in general from 10 to 70, in particular from 25 to 50, % by weight of the amount of the mixture b1+b2.

Suitable photoinitiators (b3) are the conventional photoinitiators which form a compatible layer R, and these are employed in amounts of from 0.001 to 10% by weight of the amount of the mixture b1+b2. Examples of these are benzoin and benzoin compounds, eg. benzoin methyl ether, α-methylbenzoin ethyl ether, α-methylolbenzoin methyl ether and benzoin isopropyl ether, benzil, benzil ketals, eg. benzil dimethyl ketal and benzil ethyleneglycol ketal, and polynuclear quinones, eg. 9,10-anthraquinone and the like.

In many cases it is also advantageous to add other conventional assistants and additives, such as thermal polymerization inhibitors, eg. hydroquinone, hydroquinone derivatives, nitrophenols or salts of N-nitrosocyclohexylhydroxylamine, plasticizers and/or dyes, to the layer R, depending on the specific end use to which the layer is to be put.

Suitable dimensionally stable permanent bases B for the photosensitive layers R are those which are conventionally used for the production of relief printing plates, examples being plastic films, such as polyester films, and in particular metal bases, such as iron sheets and aluminum sheets. The base may be pretreated in a conventional manner, for example provided with an adhesive, in order to improve the adhesion to the photosensitive layer R which subsequently forms the relief.

Regarding further aspects of the production and processing of the novel multi-layer elements, reference may be made to the prior art known to the skilled worker, such as the publications quoted at the beginning of this application. This also applies to their processing into relief printing plates.

The products obtained according to the invention have the advantages that relatively thick layers R of uniform quality can be produced by a simple procedure, and that the drying, shelf life and processing are improved. The application of a thin protective layer of a hydrophilic polymer, such as gelatine, gum arabic, polyvinylpyrrolidone, ethylene oxide polymers, a methyl vinyl ether/maleic anhydride copolymer or polyvinyl alcohol, to a photopolymerizable recording layer which comprises a polymeric organic binder containing acidic groups (a methyl methacrylate/methacrylic acid or styrene/itaconic acid copolymer) has been disclosed in German Published Application DAS No. 1,572,153, but this recording layer does not contain any polyvinyl alcohol as a binder, and the plates in question are offset plates which have to be provided with a barrier layer against oxygen, owing to the sensitivity of the very thin recording layer to oxygen. According to Canadian Pat. No. 1,082,026, page 3 and Example 2, offset printing plates are provided with polyvinyl alcohol protective layers. However, these protective layers tend to harden during storage (for 2 days at 50° C.), as a result of which they are difficult to subsequently remove during the usual development of the plates. It is certainly not obvious from either of the references, which relate to different objects, that just such a polyvinyl alcohol film may be used in a printing plate containing a thick photosensitive layer based on a polyvinyl alcohol/monomer mixture, in order to improve the production of thick layers, to improve the drying so that the troublesome evaporation of 2-hydroxyalkyl acrylates or methacrylates is avoided, and to improve the shelf life so that these monomers do not migrate.

The parts and percentages given in the following Examples, which illustrate the invention, and the Comparative Experiments are by weight, unless stated otherwise. The viscosity of the polyvinyl alcohols was measured as a 4% strength by weight aqueous solution at 20° C., in a Höppler viscometer.

EXAMPLES 1 TO 3 AND COMPARATIVE EXPERIMENTS C1 TO C6

Layers containing the following polyvinyl alcohols, and having, when dry, the thicknesses given in Table 1, are cast onto polyethylene terephthalate films as temporary base, and are then dried:

PVA 1=polyvinyl alcohol, degree of hydrolysis: 98 mole%, viscosity: 4 mPa.s

PVA 2=polyvinyl alcohol, degree of hydrolysis: 98 mole%, viscosity: 10 mPa.s

PVA 3=polyvinyl alcohol, degree of hydrolysis: 99 mole%, viscosity: 28 mPa.s

The films thus provided with a layer (subsequently the top layer D) are dried for about 3–7 minutes at about 83° C.

An aqueous solution, of about 70% strength, prepared from 60 parts of a water-soluble polyvinyl alcohol (hydrolyzed polyvinyl acetate) having a degree of hydrolysis of 83 mole% and a mean degree of polymerization of about 450 ($\bar{P}w$), 32 parts of 2-hydroxyethyl methacrylate, 8 parts of butanediol, 1,4-dimethacrylate, 3 parts of benzil dimethyl ketal, 0.1 part of N-nitrosodiphenylamine, 0.4 part of 2,6-di-tert.-butyl-p-cresol and 0.01 part of eosin, is cast onto the coated side of the film to give a 1.9 mm thick layer R, which is dried in a tunnel dryer at 70° C. The polyethylene terephthalate film does not become detached during drying. The tolerance in the thickness is less than 25 μm. The resulting predried but still slightly moist layer R is then laminated onto a steel sheet provided with a polyurethane adhesive. Thereafter, the polyester film (temporary base) is peeled off, and the printing plate thus produced is dried for a further 15 hours at room temperature. The shrinkage occurring during the further drying and during storage for 11 days is given in Table 1 for the various samples.

The resulting multi-layer elements can be processed in a conventional manner into relief printing plates; it was not possible to wash out the exposed plates from Comparative Experiments C3, C5 and C6 satisfactorily when these were developed using water as the solvent. The plates do not adhere to the negative and do not cause any irritation when they come into contact with the skin before development. Pre-exposed plates, when stored for as long as 10 hours, show hardly any increase in the exposure time required.

TABLE 1

| | PVA type for top layer D | Thickness of top layer D (μm) | Shrinkage on further drying (μm) | Shrinkage on storage for 11 days (μm) |
|---|---|---|---|---|
| Example 1 | PVA 1 | 1 | 73 | 170 |
| Example 2 | PVA 1 | 3 | 90 | 110 |
| Example 3 | PVA 1 | 5 | 92 | 110 |
| Comparative Experiment C1 | PVA 2 | 1 | 97 | 120 |
| Comparative Experiment C2 | PVA 2 | 3 | 82 | 93 |
| Comparative Experiment C3 | PVA 2 | 5 | 68 | 83 |
| Comparative Experiment C4 | PVA 3 | 1 | 83 | 95 |
| Comparative Experiment C5 | PVA 3 | 3 | 97 | 100 |
| Comparative Experiment C6 | PVA 3 | 5 | 88 | 100 |
| Comparative Experiment C7 | none | 0 | 150 | 300 |

COMPARATIVE EXPERIMENT C7

The procedure described above is followed, but the polyester film is not provided with a polyvinyl alcohol layer. During drying in a tunnel dryer, the layer R becomes partially detached from the polyester film, giving rise to tolerances of about 100 μm in the thickness of the layer. During further drying, the thickness of the printing plate shrinks by 150 μm, about 70 μm of this being attributable to loss of monomers. The resulting printing plate smells strongly of the monomers and becomes substantially thinner when stored exposed to air.

EXAMPLE 4

A layer R which is about 2 mm thick is cast from an aqueous solution, of about 70% strength, of a mixture of 180 parts of a commercial polyvinyl alcohol (degree of hydrolysis 88 mole%, mean degree of polymerization about 530 ($\bar{P}w$)), 110 parts of 2-hydroxyethyl methacrylate, 66 parts of 1,1,1-trimethylolpropane trimethacrylate, 12.5 parts of α-methylolbenzoin methyl ether, 0.25 parts of N-nitrosocyclohexylhydroxylamine, 0.02 part of eosin and 1 part of 2,6-di-tert.-butyl-p-cresol onto a steel sheet base B provided with an adhesive, and, after it has been predried for a short time but is still moist, is provided with a 3 μm thick top layer containing a water-soluble polyvinyl alcohol (degree of hydrolysis 99 mole%, viscosity 6 mPa.s). When the multi-layer element is subsequently dried, no substantial loss of monomers occurs, and the relief printing plates produced have good reproducible properties with are retained even when the plates are stored exposed to air for a relatively long time.

We claim:

1. A process for improving the production, drying and shelf life of a multi-layer element which is suitable for the production of a relief printing plate and comprises
   (a) a dimensionally stable base B and
   (b) a photosensitive layer R which has a bulk density of from 100 to 70,000 mg/dm$^2$ and contains a mixture which is soluble or dispersible in an aqueous solvent and comprises
      (b1) a 2-hydroxyalkyl acrylate and/or methacrylate where alkyl is of 2 or 3 carbon atoms, with or without one or more further photopolymerizable, ethylenically unsaturated monomers,
      (b2) one or more polyvinyl alcohols which are soluble or dispersible in water and have a degree of hydrolysis of 74–88 mole% and an average degree of polymerization of 200–2,000, and
      (b3) one or more photoinitiators, wherein a top layer D which is about 0.1–10 μm thick when dry and essentially of a polyvinyl alcohol having a degree of hydrolysis of not less than 95 mole% and a viscosity of 2–8 mPa.s (measured as a 4% strength by weight aqueous solution at 20° C.) is applied to the layer R.

2. The process of claim 1, wherein the polyvinyl alcohol of the photosensitive layer R has an average degree of polymerization of 250–700.

3. The process of claim 1, wherein the polyvinyl alcohol of the photosensitive layer R has a degree of hydrolysis of 80–82 mole%.

4. The process of claim 1, wherein the top layer is from 0.5 to 5 μm thick.

5. The process of claim 1, wherein the polyvinyl alcohol is a hydrolyzed polyvinyl acetate.

6. The process of claim 1, wherein the top layer D contains a finely divided pigment.

7. The process of claim 6, wherein the top layer D contains a finely divided colored pigment.

8. The process of claim 6 or 7, wherein the top layer has a rough surface with a peak-to-valley height of about 1–5 μm.

9. The process of claim 1, wherein the top layer D is applied to the layer R by providing a plastics film with a 0.1–10 μm thick polyvinyl alcohol layer, and producing the layer R on the side bearing the polyvinyl alcohol layer, or bringing the coated film into contact with a layer R, in such a manner that the polyvinyl alcohol layer adheres to the layer R and the film can be peeled off without the polyvinyl alcohol layer.

10. The process of claim 1, wherein, in the production of the multi-layer element, the top layer D is applied to the photosensitive layer R which still contains water or is moist, and thereafter the water content of the photosensitive layer R is reduced by drying.

11. A multi-layer element for the production of a relief printing plate which comprises:
(a) a dimensionally stable base (B);
(b) a photosensitive layer (R) having a bulk density of from 100 to 70,000 mg/dm², said layer (R) containing a mixture which is soluble or dispensible in an aqueous solvent, which mixture comprises:
(b1) a 2-hydroxyalkyl acrylate and/or methacrylate, said alkyl having 2 or 3 carbon atoms, with or without one or more additional photopolymerizable, ethylenically unsaturated monomers,
(b2) one or more polyvinyl alcohols which are soluble or dispersible in water and have a degree of hydrolysis of 74–88 mole% and an average degree of polymerization of 200–2000, and
(b3) one or more photoinitiators; and
(c) a layer D on top of layer R and applied to layer R, said layer D being from about 0.1–10 μm thick when dry and consisting essentially of a polyvinyl alcohol having a degree of hydrolysis of not less than 95 mole% and a viscosity of 2–8 mPa.s (measured as a 4% strength by weight aqueous solution at 20° C.).

12. A multi-layer element as defined in claim 11, wherein the polyvinyl alcohol of the photosensitive layer R has an average degree of polymerization of 250–700.

13. A multi-layer element as defined in claim 11, wherein polyvinyl alcohol of the photosensitive layer R has a degree of hydrolysis of 80–82 mole%.

14. A multi-layer element as defined in claim 11, wherein the top layer is from 0.5 to 5 μm thick.

15. A multi-layer element as defined in claim 11, wherein the polyvinyl alcohol is a hydrolyzed polyvinyl acetate.

16. A multi-layer element as defined in claim 11, wherein the top layer D contains a finely divided pigment.

17. A multi-layer element as defined in claim 11, wherein the top layer D contains a finely divided color pigment.

18. A multi-layer element as defined in claim 11, wherein the top layer D has a rough surface with a peak-to-valley height of about 1–5 μm.

* * * * *